(12) United States Patent
Jacobs et al.

(10) Patent No.: US 7,771,647 B2
(45) Date of Patent: Aug. 10, 2010

(54) ELECTRIC MICROCONTACT PRINTING METHOD AND APPARATUS

(75) Inventors: Heiko O. Jacobs, Minneapolis, MN (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 1845 days.

(21) Appl. No.: 10/316,997

(22) Filed: Dec. 11, 2002

(65) Prior Publication Data

US 2003/0178316 A1 Sep. 25, 2003

Related U.S. Application Data

(63) Continuation of application No. PCT/US01/21151, filed on Jul. 2, 2001.

(60) Provisional application No. 06/215,682, filed on Jun. 30, 2000.

(51) Int. Cl.
 *H05B 6/54* (2006.01)
 *G11C 11/23* (2006.01)
 *B41J 2/385* (2006.01)

(52) U.S. Cl. ............... 264/435; 264/436; 365/146; 365/147; 365/153; 347/141; 347/147

(58) Field of Classification Search ........... 428/195.1; 264/436, 435; 365/146, 147, 153; 347/141, 347/147

See application file for complete search history.

(56) References Cited

U.S. PATENT DOCUMENTS 3,144,650 A * 8/1964 Levine .................... 346/77 E
3,276,031 A * 9/1966 Gaynor ..................... 430/50
3,790,645 A * 2/1974 Murayama et al. .......... 525/276
3,794,986 A * 2/1974 Murayama ................. 307/400
4,149,095 A * 4/1979 Poirier et al. .............. 307/400
4,308,223 A * 12/1981 Stern ....................... 264/436
4,327,306 A * 4/1982 Stratton et al. ............. 313/419
4,503,329 A * 3/1985 Yamaguchi et al. .......... 850/1
4,522,671 A * 6/1985 Grunwald et al. .......... 156/235
4,565,772 A 1/1986 Takeoka et al.
4,566,086 A * 1/1986 Anderson ............... 369/13.01

(Continued)

FOREIGN PATENT DOCUMENTS

| EP | 0 431 249 A2 | 6/1991 |
| EP | 0 480 183 A2 | 4/1992 |
| WO | WO 98/27463 A1 | 6/1998 |
| WO | WO 01/84238 A1 | 11/2001 |

OTHER PUBLICATIONS

Majumdar, A. et al.; Nanometer-scale lithography using the atomic force microscope, Appl. Phys. Lett. 61 (19), Nov. 9, 1992, p. 2293-2295. Imported as appl_phys_lett_61_2293.pdf.*

(Continued)

*Primary Examiner*—Mark Ruthkosky
*Assistant Examiner*—Gerard T Higgins
(74) *Attorney, Agent, or Firm*—Wolf, Greenfield & Sacks, P.C.

(57) ABSTRACT

A method and apparatus for providing electric microcontact printing is provided. A stamp is brought into contact with the surface of a substrate to provide high resolution features. Aspects of the invention may be used for data storage, microcontact printing, and for other applications requiring high resolution pattern transfer.

35 Claims, 6 Drawing Sheets

U.S. PATENT DOCUMENTS 4,672,578 A * 6/1987 Munakata et al. ............ 365/118
4,735,143 A    4/1988 Weir
5,009,708 A * 4/1991 Grunwald et al. .......... 106/1.05
5,363,021 A   11/1994 MacDonald
5,666,190 A    9/1997 Quate et al.
6,210,551 B1 * 4/2001 Osman et al. ................ 205/778

OTHER PUBLICATIONS

Uchihashi, T., et al., "Charge Storage On Thin $SrTiO_3$ Film By Contact Electrification," Japanese Journal of Applied Physics, Sep. 1994, vol. 33, No. 9B, pp. 5573-5576, XP000952233, ISSN: 0021-4922, Publication Office, Tokyo, Japan.

* cited by examiner

ELECTRIC MICROCONTACT PRINTING METHOD AND APPARATUS

RELATED APPLICATIONS

This application is a continuation of PCT International Application No. PCT/US01/21151 filed Jul. 2, 2001, which was published under PCT Article 21(2) in English, and claims priority via PCT/US01/21151 to U.S. Provisional Application Ser. No. 60/215,682, filed on Jun. 30, 2000. Both applications are hereby incorporated by reference.

This invention was sponsored jointly by the Defense Advanced Research Project Agency, Air Force Research Lab and the Space and Naval Warfare Systems under Grant No. N66001-98-1-8915. The government has certain rights in the invention.

FIELD OF THE INVENTION

This invention relates to a method and apparatus for electric microcontact printing. Methods and devices for forming discrete areas of electrically and/or chemically altered material on a substrate are provided.

BACKGROUND OF THE INVENTION

Microcontact printing is a technique that can provide for the patterning of a material surface with an elastomeric stamp that has a surface coated with a self-assembled monolayer (SAM) forming molecular species. The stamping surface is placed against a surface of material and is removed to leave a self-assembled monolayer on the surface of the material according to a pattern on the stamping surface. These transferred chemical species can be used for a variety of purposes including cell adhesion, etch resists, patterning for plating and for the formation of microcircuits.

For example, techniques used to form microstamped patterns on surfaces using an elastomeric stamp are disclosed in U.S. Pat. No. 5,512,131, which is hereby incorporated by reference herein. Several techniques are described in which an elastomeric stamping surface, for example, polydimethylsiloxane, is coated with a molecular species capable of forming a SAM. The surface of the stamp may include a plurality of very small protrusions and dispersed with indentations and when this surface is brought into contact with an appropriate surface, for example, a gold coated chip, the molecular species may be transferred to the other surface in a pre-determined pattern resulting in a pattern including discrete regions of SAMs. Similar techniques are also described in U.S. Pat. Nos. 5,776,748 and 5,976,826, each of which is incorporated by reference herein.

Microcontact printing has also been used to apply other chemical species to surfaces in precise patterns, including electroless deposition catalysts and SAMs serving as optical masks (International Patent Application WO97/34025 and U.S. Pat. No. 5,951,881).

Electronic data storage involves the transfer of data, for example, computer programs, from one medium to another. Data storage methods are evaluated by a number of criteria, including storage density, which is a measure of the amount of data stored over a given area. The speed with which data can be transferred from one medium to another provides another method of evaluation. Common methods of data storage include electrical, magnetic and optical techniques. For example, optical storage devices such as compact discs and DVDs are capable of storing millions of bits on a single medium. Scanning probe lithography, using one or multiple probes, provides a method of sequentially patterning a surface with electrical charges at a resolution of as low as about 100 nm.

SUMMARY OF THE INVENTION

The invention provides an apparatus and method for transferring high resolution patterns from a stamp to a surface.

According to one aspect of the invention, a method is provided in which an electric potential is applied simultaneously to at least 5,000 discrete regions on a substrate while leaving intervening regions substantially free of applied potential.

In another aspect, an article is provided comprising a stamping surface that includes at least one protrusion that is contiguous with at least one indentation and a stamping surface including a pattern, the pattern having at least one feature having a lateral dimension of less than 100 microns. A portion of this stamping surface is electrically conductive.

In another embodiment an article comprising a flexible stamp is provided wherein at least a portion of the surface of the flexible stamp is electrically conductive.

In another embodiment a method is provided that includes the steps of contacting a substrate with flexible stamp, applying an electric potential between the substrate and the stamp and forming discrete features in a coating on the substrate.

In another embodiment, a data storage device is provided wherein the data storage device is fabricated by first contacting a substrate with a flexible stamp having a plurality of protrusions on its surface. A charge is then transferred between the stamp and the substrate and a plurality of discrete charged regions are formed on the substrate.

In another embodiment, a method of printing a surface is provided. The method includes the steps of simultaneously forming a plurality of regions of trapped charges on at least a portion of the surface wherein at least one of the regions of trapped charges have a dimension of less than 1 micron.

BRIEF DESCRIPTION OF DRAWINGS

FIG. 3A provides a photocopy of micrograph showing the surface topography of a surface that has been electrically microcontact printed;

FIG. 3B provides a surface potential distribution of pattern charges for the surface of FIG. 3A and illustrates high density storage data with less than 150 nm sized bits (FWHM);

FIG. 3C illustrates a photocopy of a Kelvin probe force microscopy image illustrating surface potential images of ring type charge patterns of 340 nm in diameter (FWHM) with approximately 130 nm sized features;

FIG. 3D illustrates the surface potential images of ring type charges having a 622 nm diameter (FWHM) with approximately 130 nm sized features;

FIG. 3E provides a photocopy of microscopic image of positively charged dots having a diameter of approximately 900 nm (recorded three weeks after generating charge pattern);

FIG. 3F provides a photocopy of microscopic image showing positively charged parallel lines approximately 10 microns in width;

FIG. 3G provides a photocopy of a microscopic image of negatively charged dots of varying size (FWHM: 122 nm, 274 nm, 330 nm);

FIG. 3H provides a photocopy of a microscopic image showing negatively charged dots of approximately 2.45 microns in diameter (FWHM);

DETAILED DESCRIPTION

Figure 1A:
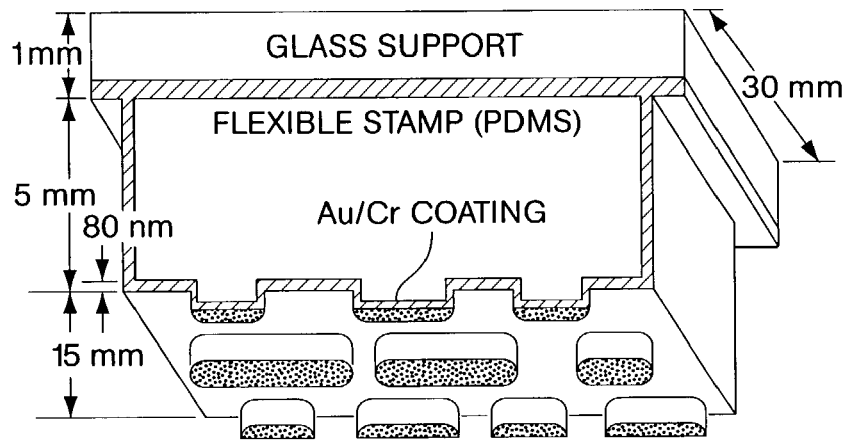
FIGS. 1A-1C provide schematic illustrations of a process of the invention that can be used to apply a pattern of trapped charges to a rigid support.

The invention provides an apparatus and method for applying pattern charges to a substrate. Electric microcontact printing, as disclosed herein, allows for a fast replication of trapped charges at high resolution (<150 nm), over large areas (>1 $cm^2$), and at high speed (<20 s). Such a replication technique is amenable to charge based data storage as it can allow for mass production of data patterns from a single master. Besides high density data storage, other aspects are also provided. For example, trapped charges can act as templates for self-assembly, and nucleation sites for molecules and small particles and the present invention may provide a technique for providing the large quantities of charge patterns that are traditionally difficult to obtain. Therefore, this technique is amenable to, for example, high resolution 'Xerographic' printing technique on a sub mm-scale. Discrete areas of charge can be formed in an electret, such as polymethyl methacrylate (PMMA), due to volume traps and dipole orientation. Activation energies for traps and dipole orientation in PMMA are about ~2 eV. The trapped charges are located at atomic sites on the molecular chain, at defects of monomeric units, and at impurities, whereas dipole orientation occurs due to the reorientation of side groups and main chains inside the polymeric film.

In one aspect of the invention, a method of quickly applying discrete charged regions on a substrate is provided. A stamp, preferably flexible, includes a surface that is electrically conductive. Molded onto a surface of the stamp is a pattern of indentations and/or protrusions. The protrusions may be plateau-like areas that extend outwardly from the surface of the stamp. The stamp is contacted with a substrate and a potential is applied between the substrate and the stamp. The electrical potential is applied for a time that is adequate to produce charged areas of the desired voltage on an electret coated substrate. For example, 20 seconds has been found adequate to provide charged areas of +1 volt on a silicon wafer coated with PMMA. By varying factors such as the composition of the substrate, the potential applied, and the desired amount of charge, the required amount of contact time may be less than 20 seconds, 10 seconds or 1 second. Numerous isolated regions of charge may be applied to a substrate simultaneously. For example, a single stamp may include more than 5000 isolated protrusions, and preferably includes more than $10^6$ isolated protrusions. Most preferably, more than $10^9$ protrusions may be included on a single stamp.

A stamp pattern is provided by a combination of at least one protrusion and at least one indentation. Preferably, multiple protrusions are provided and the protrusions may be of varying shapes and sizes. The pattern may be transferred, for example, electrically, to the substrate after bringing the stamp surface into contact with the substrate surface. "Contact" means that the protrusions are placed adjacent to the substrate surface, or are close enough to the substrate surface that an electric current can pass between the protrusion and the substrate. Preferably, the protrusions and the surface, or surface coating, are contiguous. A pattern may be a single continuous protrusion of a particular shape or may be a series of protrusions, the shapes of the surfaces of which may be, for example, round, oval, square or rectangular. The protrusions may be placed on the stamping surface in a pattern that is capable of conveying information, for example, a data or instruction set. Protrusions making up a pattern may be of similar or varied shapes and different stamps may be used on a single substrate in order to apply different patterns to the substrate surface or to result in a single composite pattern. Furthermore, stamps may be used sequentially so that one pattern may be applied over a previously applied pattern. In this way, portions of a pattern may be altered or erased after the pattern, for example, a pattern of electric charges, has been applied to the substrate surface.

A coating may be disposed on the substrate surface to receive the stamp surface. The coating may be any material that can be disposed on the substrate surface that is capable of receiving a pattern from a stamp. For example, the coating may be an electret capable of receiving and holding an electric charge, a chemical layer capable of changing oxidation state, or any other material that is capable of receiving and retaining the transfer of a pattern or portion of a pattern from a stamp surface.

"Discrete regions" are those regions on the substrate surface that may be individually identified as being affected by the stamp pattern. For example, a discrete region may correspond to a point of contact with a protrusion from the stamp's surface, the protrusion extending from a surrounding indentation, and the protrusion having affected the substrate surface in a region with which it has made contact, or near contact. For instance, the discrete region may be positively charged, negatively charged or oxidized while the area surrounding the discrete region is not as charged or oxidized. Preferably, the surrounding area is uncharged or unoxidized. The stamp may be flexible, that is, capable of deformation when minimal force is applied to the stamp in contact with a substrate surface. For example, it is preferred that some deformation of the stamp surface takes place when a coated silicon chip is brought into contact with the stamp. The stamp should be flexible enough to conform to the surface of an adjoining substrate despite surface deformities or impurities, on or in the adjoining substrate, that would result in optical interference, if a rigid stamp were used. For example, the stamp may be made out of a material that will deform upon receiving a force of 0.01, 0.1, 1 or 5 lb. per square inch.

Discrete regions of small size may be electrically addressed on a substrate. For example, each region may be less than 100 microns in size, less than 1 micron in size, less than 250 nm in size, or less than about 150 nm in size. In one embodiment, discrete regions averaging less than 150 nm in size are provided at a density of 5 Gbits/$cm^2$. In another embodiment, the discrete regions are applied to the substrate at a density of at least $10^9$ per square inch.

In addition, multiple individual discrete regions of oxides may be produced. For example, a flexible stamp including multiple protrusions may be contacted with a substrate including a surface of oxidizable material. Current may be passed through the points of contact at a rate and time adequate to produce discrete areas of oxidized material while leaving non-contacted areas unoxidized, or less oxidized.

A stamp having an electrically conductive surface may also be used to produce isolated regions of trapped charges or to affect discrete regions of a resist, in order to expose either the substrate in contact with stamp protrusions or the substrate that is not in contact with stamp protrusions.

A stamp may have at least one protrusion that defines a pattern on the stamp, and at least one feature in the pattern may have a lateral dimension of less than 100 microns. Preferably the pattern includes a feature having a lateral dimension of less than 10 microns and most preferably less than 1 micron. Examples of patterns that may be used include a series of parallel lines, circles, and matrix arrays of individually discernable discrete regions.

The material used as a stamp is preferably flexible, most preferably elastomeric such as poly(dimethylsiloxane) (PDMS). The stamps can be prepared using procedures described below. In one experiment, the PDMS stamps were ~0.5 cm thick and supported by a glass slide. To make the surface electrically conducting, 7 nm of chromium and 80 nm of gold were thermally evaporated onto the stamp.

A stamping surface can be created by a method involving the steps of fabricating a mold surface including at least one protrusion or indentation, contacting the mold surface with a hardenable fluid, hardening the fluid to form a stamp including a surface contacting the mold surface, and removing the stamp from the mold surface. Fabrication of the mold surface may be affected by patterning resist materials with electromagnetic radiation, by micromachining small dimensional features in a mold surface, by etching, plating, or the like.

Material selected for use in fabrication of the stamp is advantageously selected so as not to undergo substantial shape changes when the stamp is formed. For example, when a hardenable fluid is brought into contact with a mold surface and is hardened, it is preferred that little or no shape change should take place upon such hardening.

According to a preferred embodiment, the stamp is formed from a polymeric material. Polymeric materials suitable for use in fabrication of the stamp may have linear or branched backbones, and may be crosslinked or noncrosslinked, depending upon the particular polymer and the degree of formability desired of the stamp. A variety of elastomeric polymeric materials are suitable for such fabrication, especially polymers of the general classes of silicone polymers, epoxy polymers, and acrylate polymers. Epoxy polymers are characterized by the presence of a three-member cyclic ether group commonly referred to as an epoxy group, 1,2-epoxide, or oxirane. For example, diglycidyl ethers of bisphenol A may be used, in addition to compounds based on aromatic amine, triazine, and cycloaliphatic backbones. Another example includes the well-known Novolac polymers.

Examples of silicone elastomers suitable for use as a stamp include those formed from precursors including the chlorosilanes such as methylchlorosilanes, ethylchlorosilanes, and phenylchlorosilanes, and the like. A particularly preferred silicone elastomer is polydimethylsiloxane. Exemplary polydimethylsiloxane polymers include those sold under the trademark SYLGARD™ by the Dow Chemical Company, Midland Mich., and particularly SYLGARD™ 182, SYLGARD™ 184, and SYLGARD™ 186.

A stamp includes a stamping surface having a variety of features defined therein by indentations or protrusions. According to the invention, the stamping surface may include features having a variety of lateral dimensions. According to some embodiments of the invention, however, it is preferred to fabricate the stamping surface so as to have at least one feature with a lateral dimension of less than about 100 microns. According to other embodiments, the stamping surface may include at least one feature with a lateral dimension of less than about 50 microns, less than about 10 microns, less than about 5 microns, or less than about 1 micron. According to a particularly preferred embodiment, the stamping surface includes at least one feature with a lateral dimension of less than 0.25 microns.

The features included in the stamping surface are advantageously created in a way that the aspect ratio of any individual feature is greater than 0.2, preferably from about 0.5 to about 2.0. The aspect ratio is defined as the ratio of minimum lateral dimension of any stamping surface feature to indentation depth. In addition to the aspect ratio, the width of any indentation should not be large enough such that "bowing" of the stamping surface occurs and any portion of the indentation of the stamping surface contacts the material surface to be patterned. Such bowing is generally avoided if the ratio of indentation width (dimension c) to indentation depth (dimension x) is less than about 10.

In addition to the above-described methods for forming a stamp, a photolytic method is included in the present invention. For example, a mask may be positioned between a surface of a stamp and a source of irradiation, and the surface irradiated through the mask for a predetermined period of time. Portions of surface may be degraded by such irradiation, forming indentations in the surface upon removal of such degraded portions, and defining the stamping surface. According to this method, a variety of patterns may be very conveniently formed in a stamp according to a variety of available masks. In addition, the photolytic method may be used in combination with the above-described methods involving hardening a hardenable fluid on a mold surface. For example, a hardenable fluid may be brought into contact with a mold surface and allowed to harden to form a stamp having a first predetermined stamping surface, and the first predetermined stamping surface can be irradiated through a mask to create additional features in the stamping surface. According to this method, photoresist may be used as the stamp material itself. Particular types of polymers which may be patterned using the above-described photolytic method, preferred wavelengths for photopatterning, and lengths of time of photolysis are known in the art. In its broadest sense, the mold surface may comprise any surface having morphological features that may desirably serve as a template for the formation of a stamp, hence the patterning of protrusions or indentations on a surface. For example, a microelectronic device such as a chip may serve as a template, as may any other corrugated or indented surface.

A mold surface may be formed according to a variety of ways. According to one, the mold surface is micromachined from a material such as metal. According to another, the mold surface is formed lithographically by providing a substrate, depositing a film of material onto the substrate, coating an exposed surface of the material with resist, irradiating the resist according to a predetermined pattern, removing irradiated portions of the resist from the material surface, contacting the material surface with a reactant selected to react chemically therewith and selected to be chemically inert with respect to the resist such that portions of the material according to the predetermined pattern are degraded, removing the degraded portions, and removing the resist to uncover portions of the material formed according to the predetermined pattern to form the mold surface. Negative or positive resist may be used, and the procedure adjusted accordingly. According to another method of forming a mold surface, a substrate may be provided, and coated with resist. Then portions of the resist may be irradiated according to a particular predetermined pattern. Irradiated portions of the resist may then be removed from the substrate to expose portions of the substrate surface according to the predetermined pattern, and the substrate may be contacted with a plating reagent such that exposed portions according to the predetermined pattern are plated. Then, the resist may be removed to uncover portions of the exposed substrate according to the predetermined pattern bordered by plated portions of the substrate to form the mold surface.

A mold according to one embodiment of the present invention may be fabricated as follows. A template consisting of an exposed and developed photoresist pattern on silicon is prepared (This type of fabrication is described in any conventional photolithography text, such as *Introduction to Microelectronic Fabrication*, by Richard C. Jaeger, Gerold W. Neudeck and Robert F. Pierret, eds., Addison-Wesley, 1989). Templates such as electron microscopy grids or other corrugated materials may also be used. The template is placed in a container such as a petri dish. A 10:1 (w:w or v:v) mixture of PDMS-Sylgard Silicone Elastomer 184 and Sylgard Curing Agent 184 (Dow Corning Corp., Midland, Mich.) is poured into the petri dish. It is not necessary to put the mixture of PDMS-elastomer and curing agent under vacuum to remove dissolved dioxygen. The PDMS is cured at room temperature in the laboratory ambient for 30 to 60 min. This cure is followed by additional curing at 65° C. for approximately one hour or until the polymer is rigid. After cooling to room temperature, the PDMS-stamp is carefully peeled from the template.

In another embodiment, a flexible stamp is provided where at least a portion of a surface of the stamp is electrically conductive. The stamp or stamp surface may be coated with an electrically conductive coating or, alternatively, the material of which the stamp, or a portion of the stamp, is made, may also be conductive. For example, a surface of the stamp may be coated with a layer of gold to provide electrical conductance. The gold may be applied to the surface in a variety of ways, such as by vacuum deposition or thermal evaporation. In one embodiment, a layer of chromium, for example of about 7 nm thickness, is first applied to the surface and then followed by a gold coating of about 80 nm thickness. Of course, conductive coatings are not limited to metals, but may also include other conductive materials, such as conductive polymers.

Alternatively, the stamp material itself may be conductive. For example, an elastomeric compound containing conductive materials dispersed therein, such as carbon particles, may be used.

Preferably, the stamp material can be supplied as a liquid to a mold and can then be hardened into a polymeric material that can be separated from the mold while retaining a mold impression that may include individual protrusions or patterns having a dimension of one micron, 500 nm or as small as 100 nm. The surface of the stamp can be electrically conductive, meaning that it is capable of transferring electrons to a substrate surface with which it comes into contact. The entire stamp can be made of conductive material, or a portion of the stamp may be nonconductive and a conductive coating can be applied to the surface. For example, a metallic material may be applied to the surface of the stamp by vacuum deposition or thermoevaporation. Preferably, a conductive layer is applied at a thickness that provides adequate conductivity to conduct charge but is thin enough to not alter the pattern that may be molded into the stamp surface. Preferably, the conductive layer does not adversely affect the flexibility of the stamp surface.

The stamp may be placed on top of the substrate or the substrate may be placed on top of the stamp. Adequate contact may be achieved with a flexible stamp with no additional force other than the weight of the stamp. If the substrate, for instance, a silicon chip, which may be extremely light weight, is applied to the top of the stamp, it may be preferred that slight additional pressure be applied in order to obtain a preferred level of contact with the stamping surface.

In another aspect, a data storage device is provided. In one embodiment, a substrate capable of holding discretely charged regions is contacted with a flexible stamp having a plurality of protrusions. The substrate may be any material capable of holding a charge and in one embodiment is a silicon wafer coated with polymethylmethacrylate. The flexible stamp has numerous protrusions, each of which may correspond to a bit. The flexible stamp may be contacted with a substrate and a potential may be applied. After an adequate amount of time, those regions in contact with the protrusions on the flexible stamp will develop a charge. Preferably, the charged areas on the substrate are stable and the discrete areas of charge may be detectable after extended storage. For example, a stamp made of polydimethylsiloxane (PDMS) and coated with gold may be contacted with a silicon wafer. A voltage from about 15 to 25 volts may be preferred with the current being preferred in a range between about 10 and 100 mA/cm$^2$. The stamp may then be lifted from the substrate and individual trapped charges of approximately 1 volt may be detected on the silicon surface. In this manner, high density data storage of more than about 5 Gbits/cm$^3$ may be obtained. The discrete regions may be either positively or negatively charged.

Figure 1B:
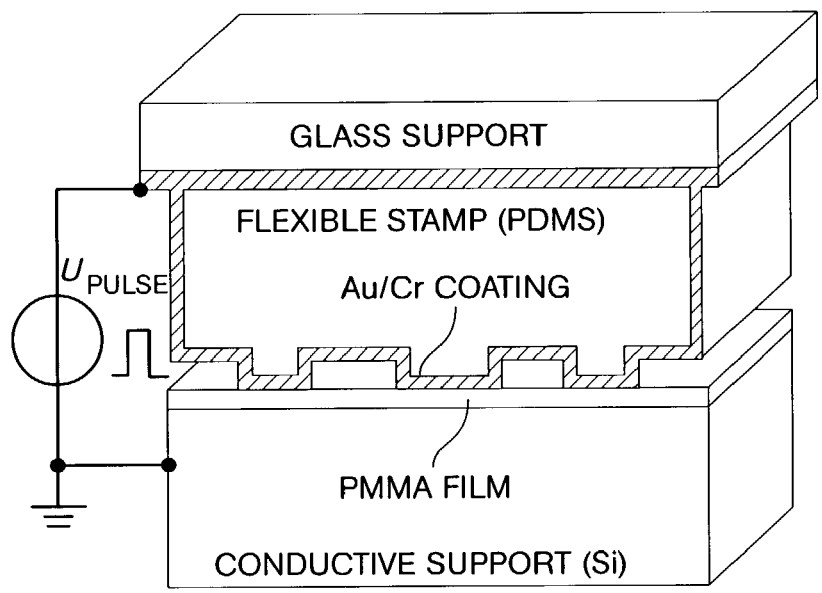
Figure 1C:
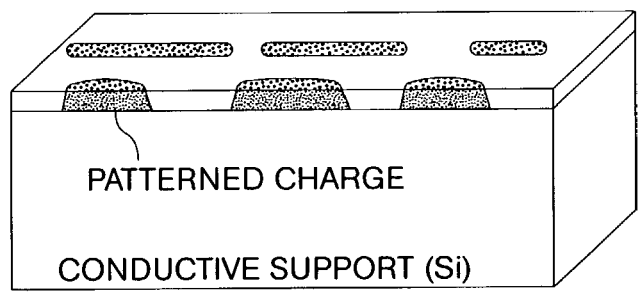

A stamp having an electrically conducting, flexible stamping surface (FIG. 1) is brought into contact with a material (electret) that can hold electrical charges. The predefined surface areas can then be exposed to electrons and electric fields. This exposure generates a pattern of, for example, trapped charge that can be detected using Kelvin Probe Force Microscopy. Kelvin Probe Force Microscopy is known to those skilled in the art and is an imaging mode for Atomic Force Microscopy that measures both the topography and electric surface potential of a substrate surface.

Electric fields may be applied between the stamp and a substrate to affect discrete regions on the substrate in a number of ways. For example, an applied electric field may be used to orient dipoles in a material or to locally oxidize discrete regions on the surface. In addition, localized electrochemistry may be performed and resists, such as electron sensitive resist and optical sensitive resist may be exposed. The use of a flexible stamp to effect these changes at high density allows for multiple impressions by using the same stamp on a series of substrates. In addition, a single mold may be used to produce multiple stamps having identical morphology. Thus, with a single mold, multiple stamps may each be used to treat multiple substrates making it possible to produce vast numbers of substrates, for example, data storage devices, having identical or near identical patterns developed thereon.

The charge storing medium can be fabricated by spinning poly(methylmethacrylate) (PMMA), a commercially available electret material with good charge storage capabilities, onto a boron doped silicon wafer (resistivity 10 Ωcm) at 5000 rpm; the thickness of the PMMA film may be about 80 nm.

This technique can provide a surface with, for example, an area of ~1 cm$^2$ with multiple features from 110 nm-100 μm in size in less than 20 s. In another embodiment, the area of the surface is less than about 1 cm$^2$. Patterns of trapped charge can serve as digital storage, and have the advantage that single bits can be erased and rewritten. By simultaneously forming or removing one, thousands, millions, or billions of charges, digital information can be written, re-written or erased from the electret.

Procedures for writing trapped charge employing scanning probe lithography may achieve a writing rate of 100 kbits/s at an area density of up to 7 Gbits/cm$^2$; ~140 times the area density of optical compact discs. It takes, however, about 1 day to write 7 Gbits onto an area of 1 cm$^2$ using this technique. The present invention, can achieve the same density in <20 s (an increase of >10$^3$ in writing speed). One way the writing speed is increased is by the ability to write thousands, or millions, of bits in parallel, or simultaneously.

Charged regions on a surface are those regions that exhibit an electrical charge that is distinguishable from an adjoining region of lesser charge. In one embodiment, charged regions are produced by applying either a positive or negative electric potential at the point of contact between the protrusions of an adjoining stamp surface and an electret coating on a silicon chip. Areas of lesser charge, or those that define an intervening lack of charge between charged regions, correspond to indentations on the stamping surface that transfer a lesser charge, or no charge at all, to the corresponding regions on the substrate surface. The voltage difference between the discrete charged regions and the adjoining regions of lower charge may be for example, 0.1 volt, 1 volt, 10 volts or 100 volts. The voltage of the adjoining regions of lower charge may also be less than ½ the voltage or less than about 0.1 x the voltage of the discrete charged regions. Charged regions may be of any dimension and can be measured by full width at half maximum (FWHM). Charged regions may be individual points, lines or other geometric shapes such as circles, ellipses or individually designed shapes.

A pattern of charge on a substrate surface may be made from any pattern or combinations of patterns that can be formed on the adjoining stamp. Depending on the materials used, the potential may be over the range of 1 mV to more than a kV. The range of about 100 millivolts to 20 volts has been shown to be useful to expose films having a thickness of up to 200 nm. Preferably, if thicker films are used, for example films of 1 micron, 10 microns, 100 microns or 1 millimeter in thickness, a higher potential can be applied to achieve desired exposure. The potential applied for some films may exceed 1 kV.

In an alternative embodiment, the substrate surface is flexible and the stamp is rigid. The flexible substrate may be, for example, a thin wafer of silicon with an electret coating that is flexible enough to conform to the surface of a rigid stamp. In this case, the stamp and/or the stamping surface may be of rigid material.

Example 1

To generate a pattern of trapped charge, a metal-coated PDMS stamp (as provided above) was placed on top of a PMMA coated chip and a voltage pulse was applied between the gold on the PDMS and the silicon of 15-25 V, while monitoring the current (typically: 10-100 mA/cm$^2$), and the total charge transferred (0.01-1 C/cm$^2$, 624-62400 electrons/nm$^2$). After the PMMA had been exposed, the PDMS stamp was removed by hand and the charge patterns were characterized using Kelvin Probe Force Microscopy (KFM). KFM is an imaging mode for Atomic Force Microscopy that measures the distribution of both topography and electric surface potential, and is known to those of skill in the art.

Figure 2A:
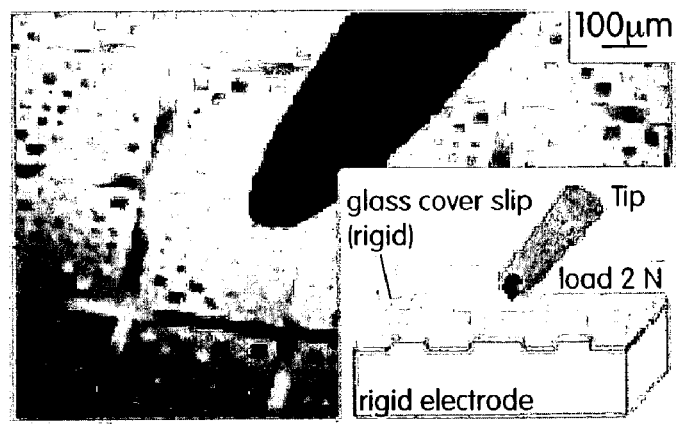
FIG. 2A is a photocopy of an optical micrograph that shows an optical interference pattern between a rigid stamp and a rigid surface at a load of 2 N.
Figure 2B:
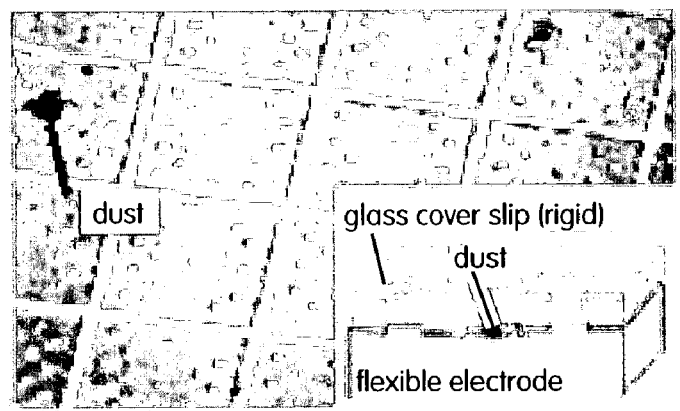
FIG. 2B is a photocopy of an optical micrograph that illustrates a lack of optical interference when a flexible stamp contacts a rigid surface.

Two different systems were evaluated to determine the level of contact attainable between the stamp and the PMMA surface. The systems were: (i) a rigid electrode (a silicon wafer supporting a pattern in metal, 7 nm of Cr, and 80 nm of Au, thermally evaporated), and (ii) a flexible, metal-coated stamp of PDMS. FIGS. 2a and 2b show two optical microscope images of the optical interference pattern occurring at the interface between the stamp and the substrate. With the rigid pattern transfer element (Si/SiO2/Cr/Au), there was always optical interference at the interface as shown in FIG. 2a. This interference may have been due to non-uniform spacing between the substrate and the patterning element, which, with exceptions, is on the order of the optical wavelength. Significant pressure was required at a point to get small (<500 µm in diameter) areas that showed no optical interference phenomena, and where the substrate and patterning element seemed to be in contact. The electric contact resistance of such contacts depended, however, strongly on the applied pressure, the rigidity of both surfaces, and the amount and type of contamination at the interface.

On the contrary, the flexible stamp (2b) gave large contact regime without applied pressure and without optical interference patterns.

Figure 2C:
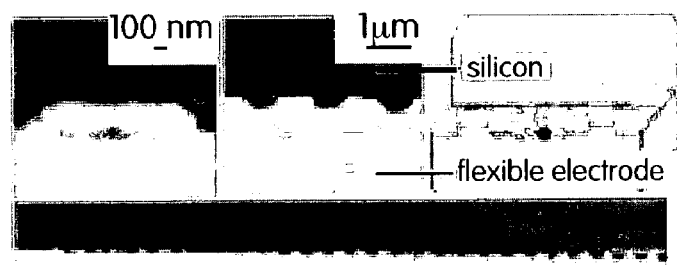
FIG. 2C provides a photocopy of an SEM image of a flexible stamp/rigid surface contact illustrating contact areas that are about 1 micron in diameter with spacing of less than 10 nm.
Figure 3A:
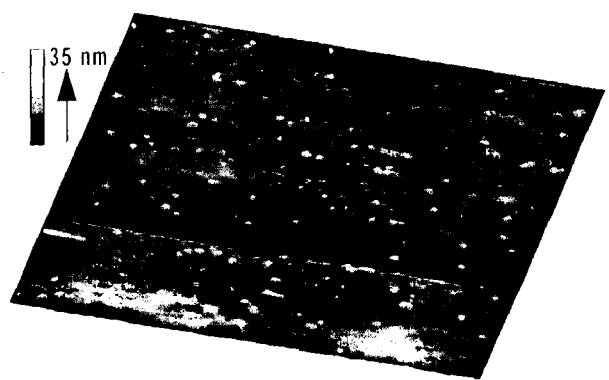
FIGS. 3A-3H provide photocopies of Kelvin probe force microscopy images showing topographical and positive and negative charge patterns of different sizes and shapes.
Figure 3B:
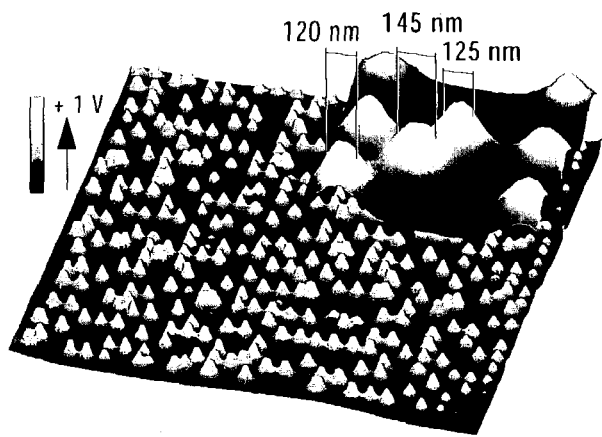
Figure 3C:
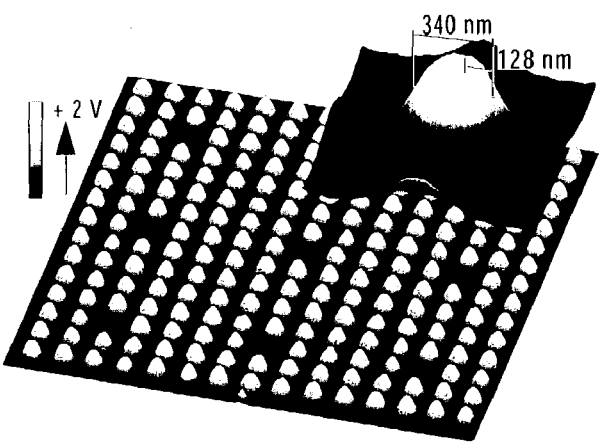
Figure 3D:
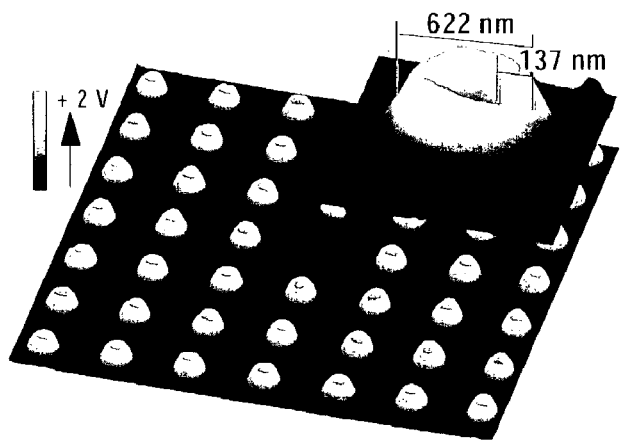
Figure 3E:
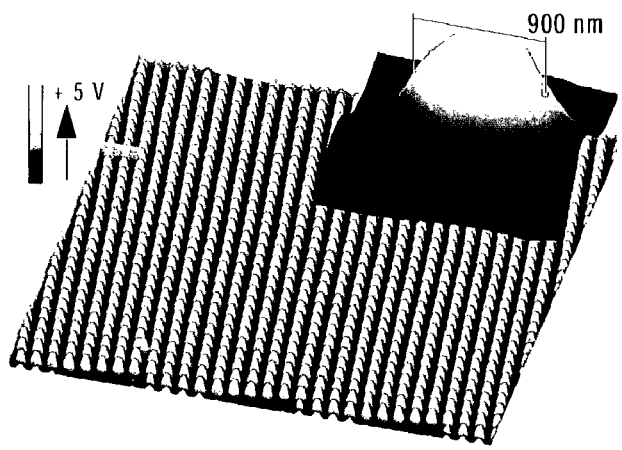
Figure 3F:
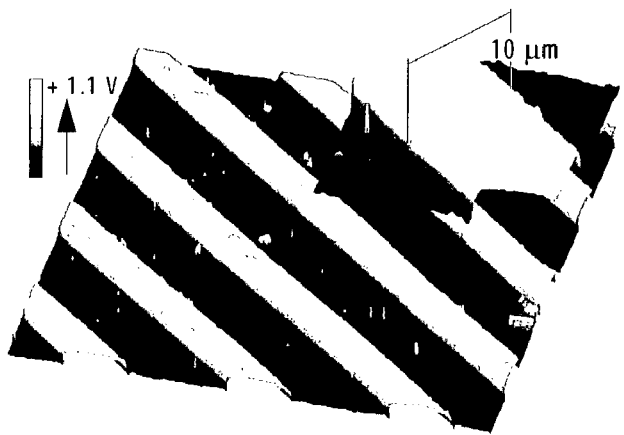
Figure 3G:
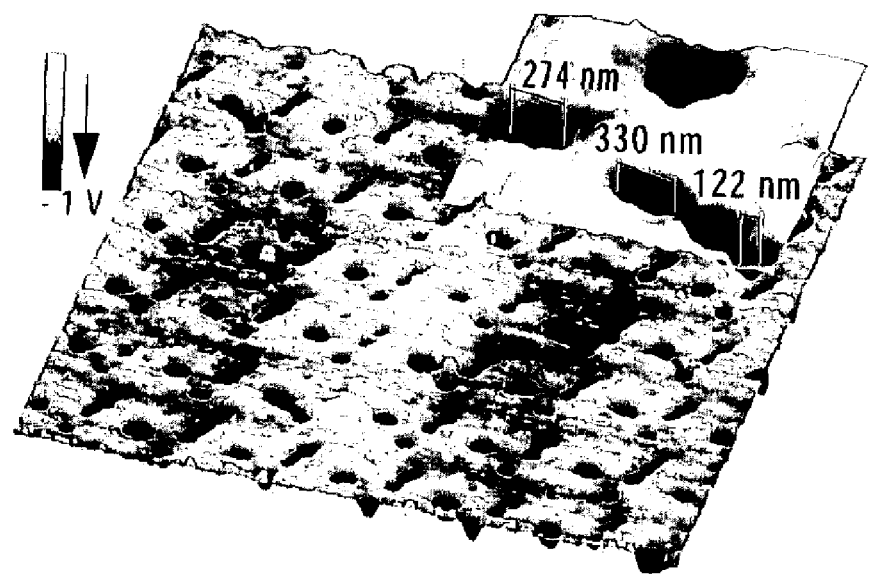
Figure 3H:
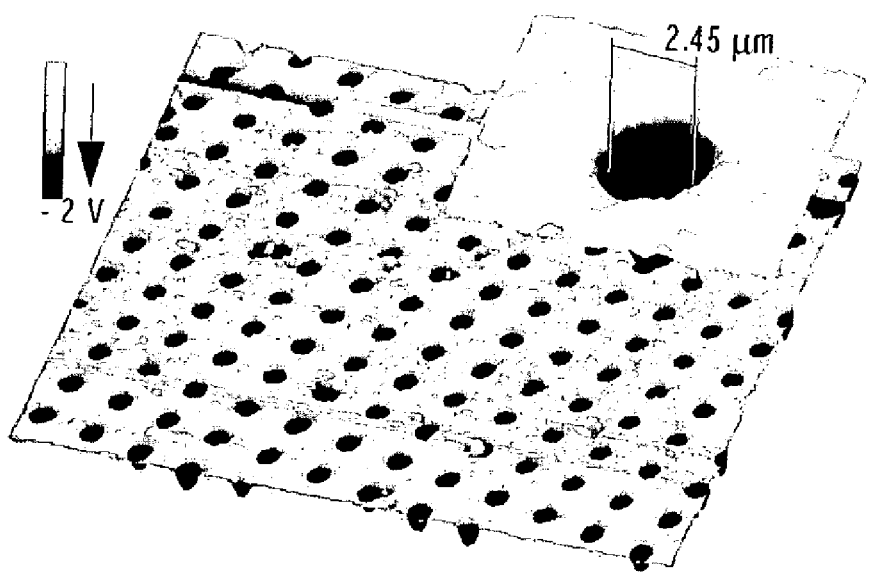

FIG. 2c shows an SEM image of the interface of such contacts (obtained by placing a flexible stamp on top of a rigid silicon substrate, see inset). No spacing (<10 nm) can be detected between the silicon substrate and the stamp. This observation reveals that close contacts were established over large areas. For such micro/nano contacts, the local uniformity is defined predominantly by the local surface roughness of the flexible stamp and of the PMMA coating (in both cases, <5 nm).

Example 2

FIG. 3 shows patterns of localized charge in PMMA generated by the electric micro-contact printing of the invention. All images were recorded by KFM. FIG. 3a shows the measured topography and FIG. 3b shows the measured surface potential distribution of a surface patterned in a way that simulates the pattern required for high density data storage (<150 nm sized bits; full width at half maximum, FWHM; density=5 Gbits/cm$^2$). To write this charge pattern, the resist was locally exposed with a current density of 20 mA/cm$^2$ (18 V) for 10 s by applying a positive potential between the metal-coated stamp and the silicon wafer coated with PMMA. The trapped charges changed the local surface potential (3b) by about ~1 V whereas the PMMA topography (3a) does not seem to be affected. By using another pattern on the stamp, other types of charge patterns can be generated. For example, FIGS. 3c and 3d show ring type charge patterns with ~140 nm sized features; FIGS. 3e and 3f show positively charged dots (900 nm diameter) and lines (10 micrometers wide). Furthermore, the generated charge patterns appear consistent and similar over large areas. To pattern negative charges in the PMMA the surface was exposed with a negative stamp potential. For the patterns illustrated in FIGS. 3g and 3h, a −20 V voltage pulse of 15 s duration was applied to the stamp.

Figure 4:
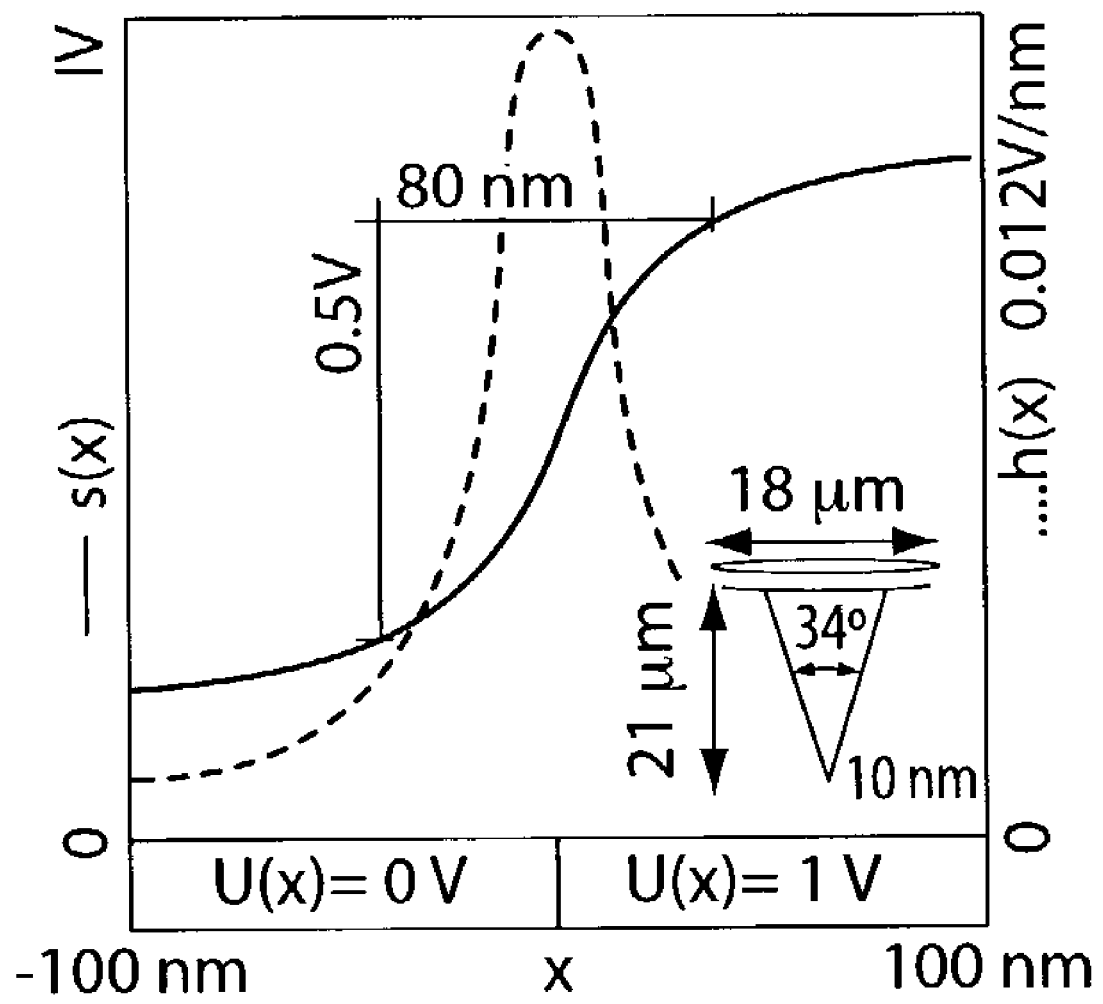
FIG. 4 provides a graph showing the step response (s(x)) and transfer function (f(x)) of the Kelvin probe.

The image was evaluated over time to assess the time stability of the charge pattern. The image in FIG. 3e was recorded three weeks after generating the charge pattern; the similarity of the images indicates that no significant diffusion of the charges trapped in PMMA occurred over this interval. Charged areas as small as about 150 nm wide were generated. At such a small scale, the transfer-function (FIG. 4) of the Kelvin probe may be the limiting factor as these dimensions are close to the resolution limit of the instrument. Taking this analytical resolution into account, the actual surface potential distribution may have sharper edges than imaged by the instrument.

Further modifications and equivalents of the invention herein disclosed will occur to persons skilled in the art using no more than routine experimentation, and all such modifications and equivalents are believed to be within the spirit and scope of the invention as defined by the following claims.

What is claimed is:

1. A method comprising:
    providing a stamp comprising a polymer and having a surface including at least 5000 protrusions that are electrically conductive, and at least one indentation, wherein the at least 5000 protrusions are formed from the polymer; and
    contacting at least 5000 discrete regions on a substrate with the at least 5000 protrusions and applying an electrical potential using the stamp simultaneously to at least the 5000 discrete regions on the substrate while leaving intervening regions substantially free of applied potential.

2. The method of claim 1 wherein at least one of the discrete regions has a dimension of less than 1 μm.

3. The method of claim 2 wherein the applied electric potential is from 1 mV to 1 kV.

4. The method of claim 3 wherein the applied electric potential is from 100 mV to 20 V.

5. The method of claim 2 wherein the discrete regions are charged.

6. The method of claim 5 wherein the discrete regions receive a charge density of 0.01 to 1 $C/cm^2$.

7. The method of claim 5 wherein the discrete regions are positively charged.

8. The method of claim 5 wherein the discrete regions are negatively charged.

9. The method of claim 2 wherein the electric potential is applied at a current density of 10 to 100 $mA/cm^2$.

10. The method of claim 1 wherein at least one of the discrete regions has a dimension of less than about 250 nm.

11. The method of claim 1 wherein the discrete regions are applied to the substrate at a density of at least $10^9$ per square inch.

12. The method of claim 1 comprising oxidizing material at each of the discrete regions.

13. The method of claim 1 comprising trapping charges at each of the discrete regions.

14. The method of claim 1 wherein the discrete regions comprise resist.

15. The method of claim 1 wherein the discrete regions are in a coating of PMMA.

16. The method of claim 15 wherein the PMMA is coated onto a silicon wafer.

17. A method of claim 1, wherein the discrete regions are chemically altered.

18. The method of claim 1, wherein the substrate is chemically altered by changing the oxidation state of a portion of the substrate.

19. A method comprising:
    contacting a substrate with a stamp comprising a polymer and having a surface wherein at least a portion of the surface is electrically conductive, the surface having at least one indentation and at least one protrusion formed from the polymer;
    applying an electrical potential between the substrate and the at least one protrusion of the stamp; and
    forming discrete features in a coating on the substrate.

20. The method of claim 19 further including passing current between the substrate and the at least one protrusion of the stamp.

21. The method of claim 19 wherein the discrete features are charged.

22. The method of claim 19 further comprising a step of growing oxides in the coating.

23. A method of printing a surface comprising:
    simultaneously forming a plurality of regions of trapped charges on at least a portion of the surface using a stamp comprising a polymer and having a surface wherein at least a portion of the surface is electrically conductive, the surface having at least one indentation and at least one protrusion formed from the polymer, wherein the plurality of regions of trapped charges are formed by applying an electrical potential between the surface and the at least one protrusion of the stamp; and wherein at least one of the regions has a dimension of less than 1 um.

24. The method of claim 23 wherein at least a second portion of the surface is charged at less than ½ the voltage of the regions of trapped charges.

25. The method of claim 23 wherein at least a second portion of the surface is charged at less than about 0.1 x the voltage of the regions of trapped charges.

26. The method of claim 23 wherein the surface is less than about 1 $cm^2$ in dimension.

27. The method of claim 19 wherein the stamp is elastomeric.

28. The method of claim 19 wherein the stamp is flexible.

29. The method of claim 23 wherein at least a second portion of the surface is charged at 1 Volt less than the voltage of the charged regions.

30. The method of claim 23 wherein at least a second portion of the surface is charged at 0.1 Volts less than the voltage of the charged regions.

31. The method of claim 23 wherein at least a second portion of the surface is charged at 100 Volts less than the voltage of the charged regions.

32. The method of claim 23 wherein at least a second portion of the surface is charged at 10 Volts less than the voltage of the charged regions.

33. The method of claim 1, wherein the stamp comprises an elastomer having a conductive material dispersed therein.

34. The method of claim 19, wherein the stamp comprises an elastomer having a conductive material dispersed therein.

35. The method of claim 23, wherein the stamp comprises an elastomer having a conductive material dispersed therein.

* * * * *